United States Patent [19]

Derwin et al.

[11] Patent Number: 5,731,547
[45] Date of Patent: Mar. 24, 1998

[54] CIRCUITIZED SUBSTRATE WITH MATERIAL CONTAINMENT MEANS AND METHOD OF MAKING SAME

[75] Inventors: Mark Daniel Derwin, Binghamton; Daniel Peter Labzentis, Endicott; Jonathan David Reid, Johnson City; Timothy Lee Sharp, Berkshire, all of N.Y.

[73] Assignee: International Business Machines Corporation, Armonk, N.Y.

[21] Appl. No.: 603,629

[22] Filed: Feb. 20, 1996

[51] Int. Cl.⁶ ........................................... H05K 1/09
[52] U.S. Cl. .................. 174/251; 174/52.2; 174/52.4; 174/252
[58] Field of Search ........................ 174/255, 260, 174/250, 261, 52.4, 52.2, 51; 361/760, 761, 762, 764, 765, 812; 29/885, 856, 841, 883; 257/787

[56] References Cited

U.S. PATENT DOCUMENTS

| | | | |
|---|---|---|---|
| 4,218,701 | 8/1980 | Shirasaki | 257/778 |
| 4,814,943 | 3/1989 | Okuaki | 361/400 |
| 5,001,604 | 3/1991 | Lusby | 361/398 |
| 5,087,961 | 2/1992 | Long et al. | 257/701 |
| 5,173,766 | 12/1992 | Long et al. | 257/687 |
| 5,253,010 | 10/1993 | Oku et al. | 396/542 |
| 5,284,548 | 2/1994 | Carey et al. | 156/630 |
| 5,336,931 | 8/1994 | Juskey et al. | 257/787 |
| 5,382,759 | 1/1995 | Kei Lau et al. | 174/264 |

FOREIGN PATENT DOCUMENTS 5082970  4/1993  Japan.

Primary Examiner—Kristine L. Kincaid
Assistant Examiner—Kristina Soderquist
Attorney, Agent, or Firm—Lawrence R. Fraley

[57] ABSTRACT

A circuitized substrate having conductive circuitry thereon and a barrier located adjacent at least portions of the circuitry to serve as an effective constraint for liquid material (e.g., encapsulant) applied to cover and protect the circuitry. The barrier can be formed concurrently with circuitry formation and formed of materials (e.g., copper, nickel, gold) similar to those used for the circuitry. The barrier is of two-part construction and of a particular shape wherein one part affords a greater surface tension than the other such that the material may actually lie on one part while being prevented from engagement with the other. Providing such dual (or "progressive") surface tensions successfully constrains the liquid material at least until solidification thereof occurs.

39 Claims, 5 Drawing Sheets

CIRCUITIZED SUBSTRATE WITH MATERIAL CONTAINMENT MEANS AND METHOD OF MAKING SAME

TECHNICAL FIELD

The invention relates to circuitized substrates and to methods for the manufacture of such circuitized substrates. Particularly, the invention relates to such circuitized substrates as may be used in electronic packaging for use in information handling systems (computers).

BACKGROUND OF THE INVENTION

Many electronic components used on circuitized substrates need to be encapsulated with a polymer material or the like after being attached to the substrate, which in turn may comprise a ceramic carrier, printed circuit board/card, or other type of electronic packaging medium. The encapsulation material typically serves to protect the component (and adjacent circuitry) from moisture, corrosion, and physical damage.

It is also a common requirement of many packages that the encapsulation material be constrained to a specified region of the package, typically on the upper surface of the substrate. Such a requirement may be desired to save materials, time, and, therefore, costs of the final assembly.

Circuitized substrates such as those described above for use in electronic packaging are known, with examples shown in U.S. Pat. Nos. 5,173,755 (Long et al) and 5,336,931 (Juskey et al), while various methods used to manufacture such circuitized substrates (e.g., printed circuit boards) are described in U.S. Pat. Nos. 5,001,604 (Lusby), 5,284,548 (Carey et al) and 5,382,759 (Kei Lau et al).

In U.S. Pat. No. 5,173,766, encapsulant is constrained by a casting frame of approximately the same height as the required encapsulation material. The casting frame is produced independent of the substrate, and is added in an assembly process some time after the circuits have been formed on the substrate. An inner encapsulant dam, made of an insulating material, acts as a first encapsulant dam, temporarily constraining a first encapsulant material. This material must of necessity be an insulator because if conductive it could short together circuits in the structure. The insulating material in this structure is produced in a separate process step or steps, and is subsequently laminated to a conductive film.

In U.S. Pat. No. 5,336,931, a polymer-based dam material is dispensed on the substrate in a separate step from that which forms the article's circuitry. The encapsulant material is dispensed such that it does not flow over the dam material, and is shown to be constrained within the inner surface of the dam (not flowing over the dam's top edge and being constrained on the outer edge).

In accordance with the teachings herein, the present invention defines a circuitized substrate in which an effective material (e.g., encapsulant) barrier is provided which is relatively easy to form on the substrate's surface substantially concurrently with formation of the substrate's circuitry. The barrier is made of similar materials as the circuitry and, by its unique configuration, is able to provide effective liquid material constraint while not being of a relatively tall, possibly obstructive configuration in comparison to the thickness of the corresponding substrate circuitry. This barrier can be provided without extensive modification to the apparatus and processes currently used to produce such substrates, thus assuring relatively low costs for such production.

It is believed that a circuitized substrate and process for making same which afford the above advantages as well as others discernible from the teachings herein would constitute a significant advancement in the art.

DISCLOSURE OF THE INVENTION

It is an object of the invention to enhance the circuitized substrate art.

It is another object of the invention to provide a circuitized substrate comprising circuitry and a barrier member for containment of encapsulation material wherein the barrier member can be formed concurrently with formation of the substrate's circuitry, thereby reducing time and other costs for making such a product.

It is still another object of the invention to provide a method for forming a substrate comprising circuitry and a barrier member for containment of encapsulation materials.

It is yet another object of the invention to provide such a method for making such a product which is readily adaptable to mass production operations, thereby further reducing costs associated with production.

In accordance with one aspect of the invention, there is provided a circuitized substrate including a dielectric layer including a first surface, an electrical conductor positioned on the first surface of the dielectric layer, and a barrier member for preventing the flow of liquid material thereover. The barrier member includes a first portion of a first configuration positioned on the first surface of the dielectric layer adjacent the electrical conductor and a second portion of a second configuration positioned on the first portion. The first portion of the barrier member provides a greater surface tension with respect to the liquid than the second portion of the barrier member.

In accordance with another aspect of the invention, there is provided a method of forming a circuitized substrate which comprises the steps of providing a dielectric layer having a first surface, positioning an electrical conductor on the first surface of the dielectric layer, and forming a barrier member on the first surface of the dielectric layer for preventing the flow of liquid material thereover by initially forming a first portion on the first surface of the dielectric layer adjacent the electrical conductor and thereafter forming a second portion on the first portion of the barrier member. The first portion of the barrier member is formed of a first configuration and the second portion of the barrier member is formed of a second configuration, the first portion providing a greater surface tension with respect to the liquid material than the second portion.

BEST MODE FOR CARRYING OUT THE INVENTION

For a better understanding of the invention, together with other and further objects, advantages and capabilities thereof, reference is made to the following disclosure and appended claims in connection with the above-described drawings. It is understood that like numerals will be used from FIG. 1 to FIG. 8 to identify similar elements. It is also understood that the various elements of the invention as illustrated herein are not necessarily to scale and in fact may be exaggerated in size for enhancing illustration and description thereof.

Figure 1:
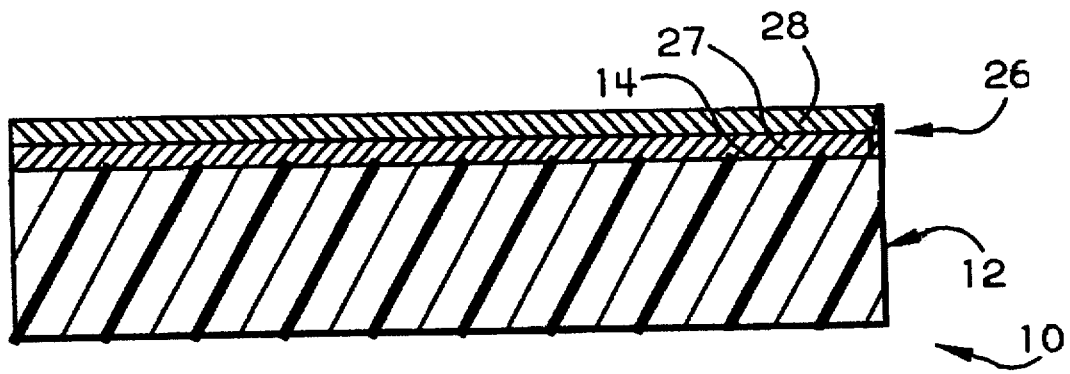
FIG. 1 is a much enlarged view of a base substrate with deposited metal layers, in accordance with one embodiment of the invention.

In FIG. 1, there is shown a first step in the manufacture of a circuitized substrate 10 in accordance with one embodiment of the invention. In FIG. 1, a seed layer 26 (e.g., chromium) is deposited on the first surface 14 of the dielectric material 12 (e.g., fiberglass-reinforced polymer resin, also known as "FR4" material) which forms the base layer for the invention. Material 12 is preferably polyimide, a known polymer. The seed layer may be deposited using sputter vacuum deposition techniques known in the integrated circuit industry, or alternatively may be laminated, chemically activated, or otherwise deposited, also using well-known procedures. Further description of these processes is thus not believed necessary. In a preferred embodiment, layer 26 is formed of two individual metals or metal alloys (27, 28), the first metal or metal alloy preferably chromium (as stated) and the second metal or alloy 28 preferably copper. In a preferred embodiment, chromium was deposited to a thickness of only about 0.8 microinches and a layer of copper having a thickness of about 24 microinches added thereto.

Figure 2:
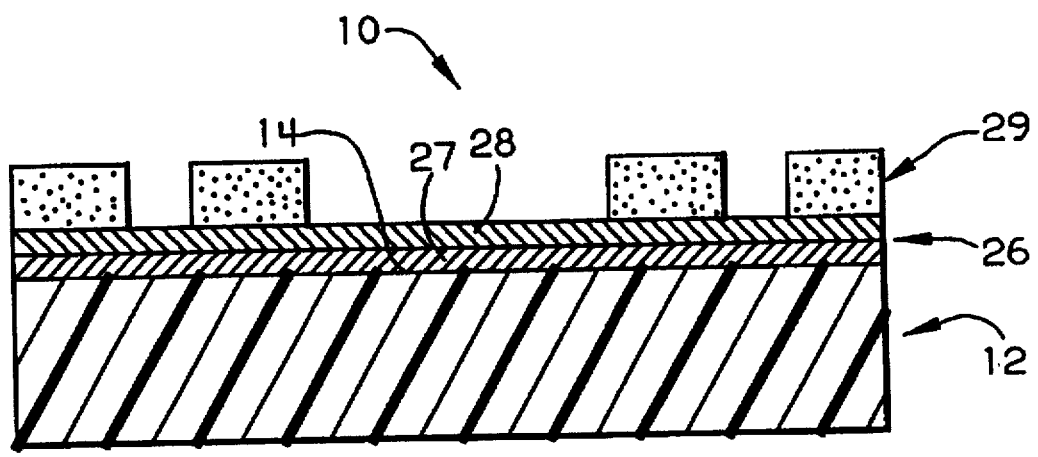
FIG. 2 illustrates the substrate and layers of FIG. 1, with the addition of a layer of photoresist in accordance with one embodiment of the invention.

In FIG. 2, there is shown a subsequent step in the manufacture of circuitized substrate 10. In FIG. 2, a layer of photoresist material 29 is deposited on seed layer 26, irradiated in accordance with the recommendations of the photoresist manufacturer, and chemically processed to remove desired portions of said photoresist. A preferred photoresist material for use in the invention is Hercules CFI dry film resist available from Hercules, Inc., Wilmington, Del. This is a negative photoresist. In one embodiment, layer 29 had a thickness of about 0.001 inches, and was applied using conventional lamination technology.

Figure 3:
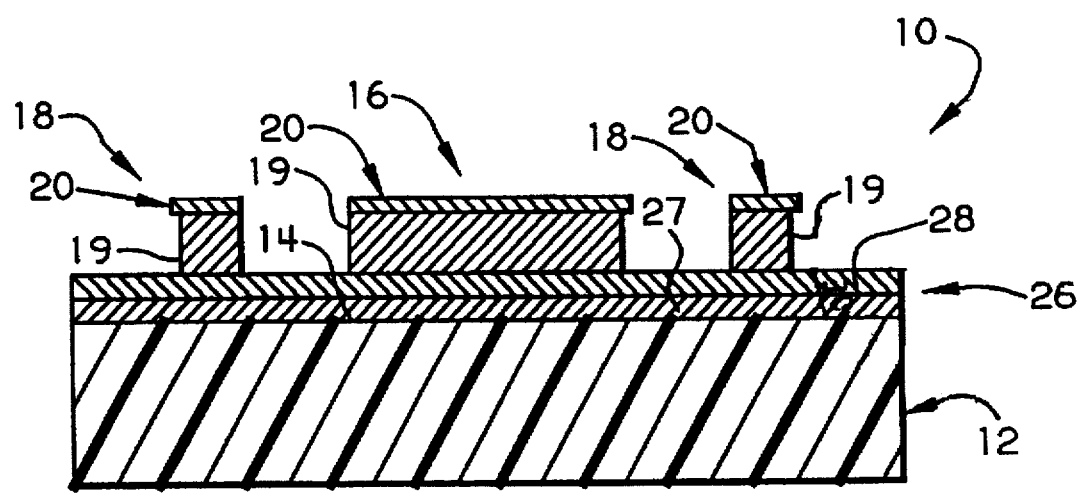
FIG. 3 illustrates the substrate of FIG. 2 following the formation of first and second portions of a barrier member and adjacent circuitry in accordance with one embodiment of the invention.

In FIG. 3, a barrier member 18 and electrical conductor 16 are formed simultaneously, preferably using a known electroplating process. More specifically, the substrate is immersed in a solution containing an ionic source of deposited copper, such as copper sulfate. Direct current is passed through the solution, with the substrate being the negative terminal of the circuit in the solution, thus causing the reduction of ionic copper to metallic copper on the substrate in areas defined by the layer of photoresist material. Two barrier members 18 are shown, it being understood that only one can be used in accordance with the teachings herein, e.g., to only control material on one side of conductor 16. Conductor 16 may function as a circuit line and/or conductive pad in the final circuitry of substrate 10. Using the above electroplating process, conductor 16, and, of course, barrier member 18, are of bi-layered construction, including a first portion 19 of a first layer of copper having a thickness of about 0.0005 to 0.0015 inches and a second portion of a second layer 20 of a different metal or metal alloy, preferably gold, from layer 19. Layer 20 is preferably about 20 to about 90 microinches thick. As described below, layer 20 is preferably comprised of two parts.

Figure 4:
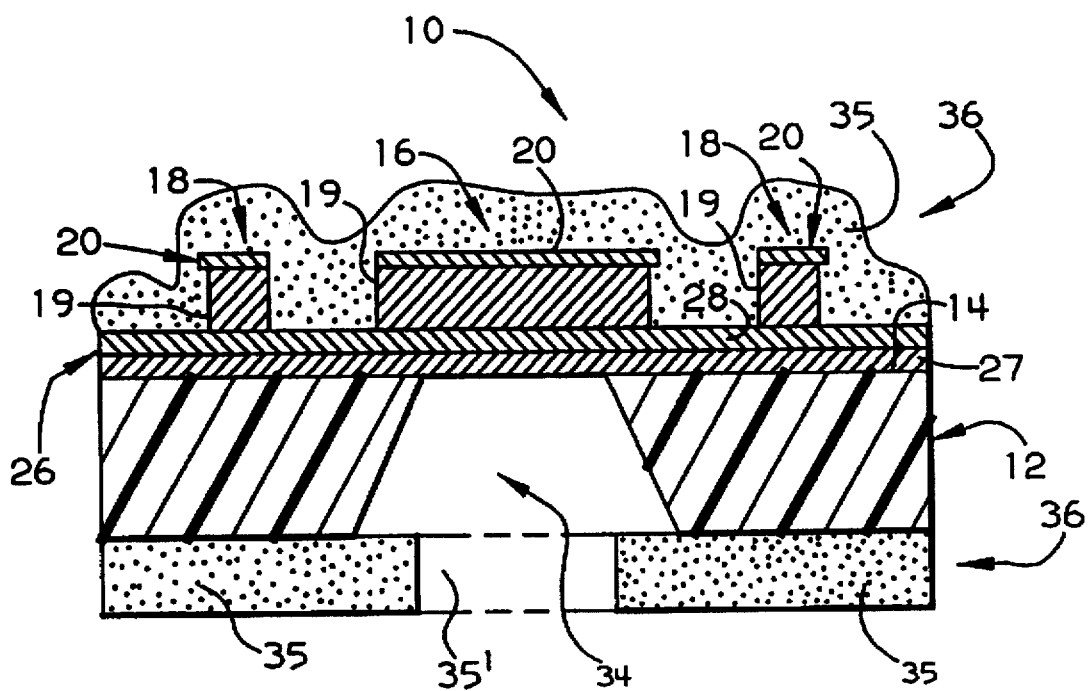
FIG. 4 illustrates the circuitized substrate of FIG. 3 with a layer of photoresist material applied to both sides, this material exposed and developed to expose dielectric material on one side (the bottom in FIG. 4), and the dielectric material then removed (e.g., chemically etched)

In FIG. 4, a subsequent process step is shown illustrating the formation of a hole 34 in dielectric layer 12. In FIG. 4, a second layer 35 of photoresist 36 is deposited on the dielectric layer 12 and completely covers both the barrier members 18 and adjacent electrical conductor 16. This second photoresist is then exposed in accordance with the recommendations of the photoresist manufacturer, and chemically processed to remove portions thereof. The underlying dielectric material is then removed, preferably using chemical etching. This second photoresist material is preferably different than photoresist material 29 and, specifically, a photoresist having adequate chemical resistance to etchants used in subsequent processing of the invention. An example is duPont 330R, available from the E. I. duPont de Nemours Company, Wilmington, Del. Understandably, layer 35 extended entirely across dielectric material 12 on both the upper and lower surfaces. A region 35' is removed, exposing material 12 thereunder. This part of material 12 is then removed (etched) to the tapered configuration illustrated.

Figure 5:
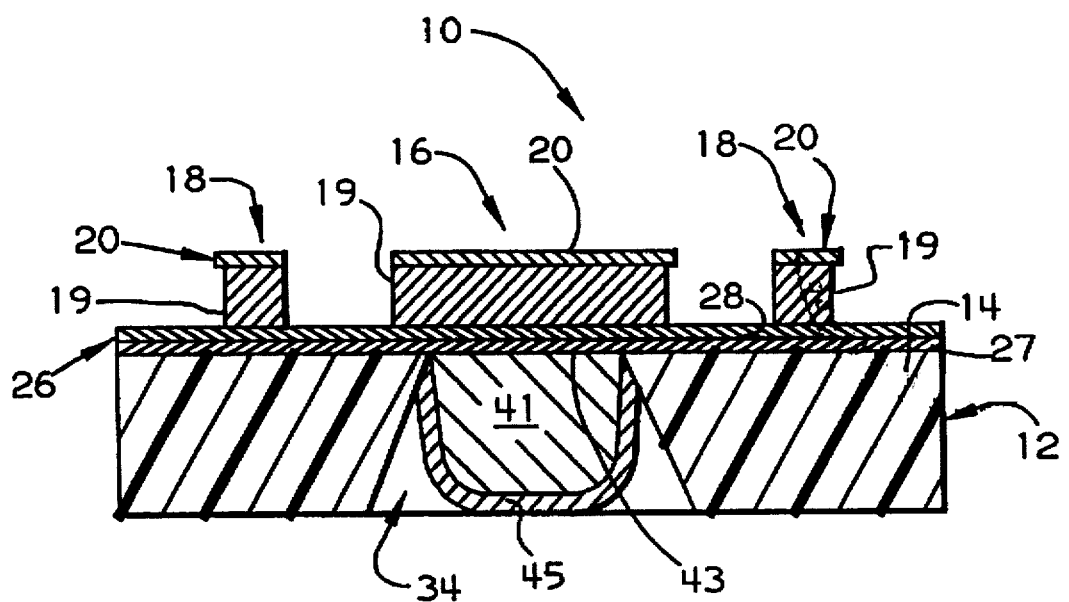
FIG. 5 illustrates the circuitized substrate of FIG. 4 following formation of a two-part electrical conductor within an opening in the dielectric material, in accordance with one embodiment of the invention.

In FIG. 5, a second part 41 of the electrical conductor 16 is formed on the exposed undersurface 43 of conductor 16 that bridges hole 34. This is preferably accomplished using electroplating. Second part 41 of conductor 16 projects through hole 34, and preferably includes a thin layer of gold 45 thereon, preferably formed by electroplating. As seen, part of photoresist material 36 has been removed, this occurred following formation of second part 41. In a preferred embodiment, second part 41 had a thickness of about 0.001 inch and gold layer 45 a thickness of about 20 to 90 microinches. Part 41 spanned the entire width of hole 34 beneath the already formed first part of conductor 16, for a total distance in one embodiment of about 0.015 inch. One example of a use for second pad 41 is to provide an electrical and/or thermal path to an external component such as a circuit board or heat sink.

Figure 6:
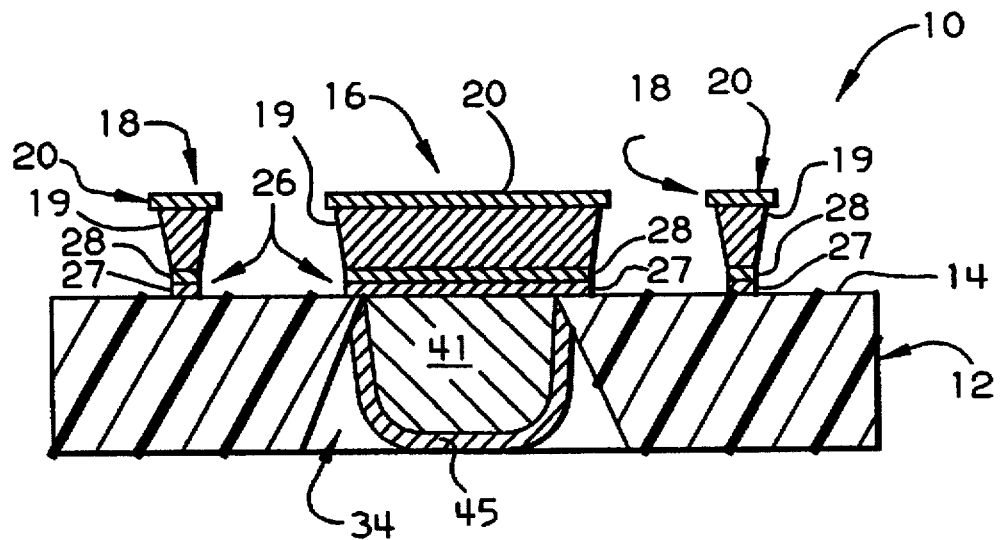
FIG. 6 Illustrates the circuitized substrate of FIG. 5 following removal of the metal layers deposited in the embodiment of FIG. 1.

In FIG. 6, portions of seed layer 26 that were unprotected by barrier member 18 and electrical conductor 16 are removed, preferably using a chemical etching process. This was accomplished by developing and removing photoresist above layer 26 that such removal was desired for (now shown in FIG. 6). The mentioned chemical etching process also resulted in a slight tapering of the side walls of both conductor 16 and barrier members 18. Such tapering represents a significant aspect of the invention, as described hereinbelow.

Figure 7:
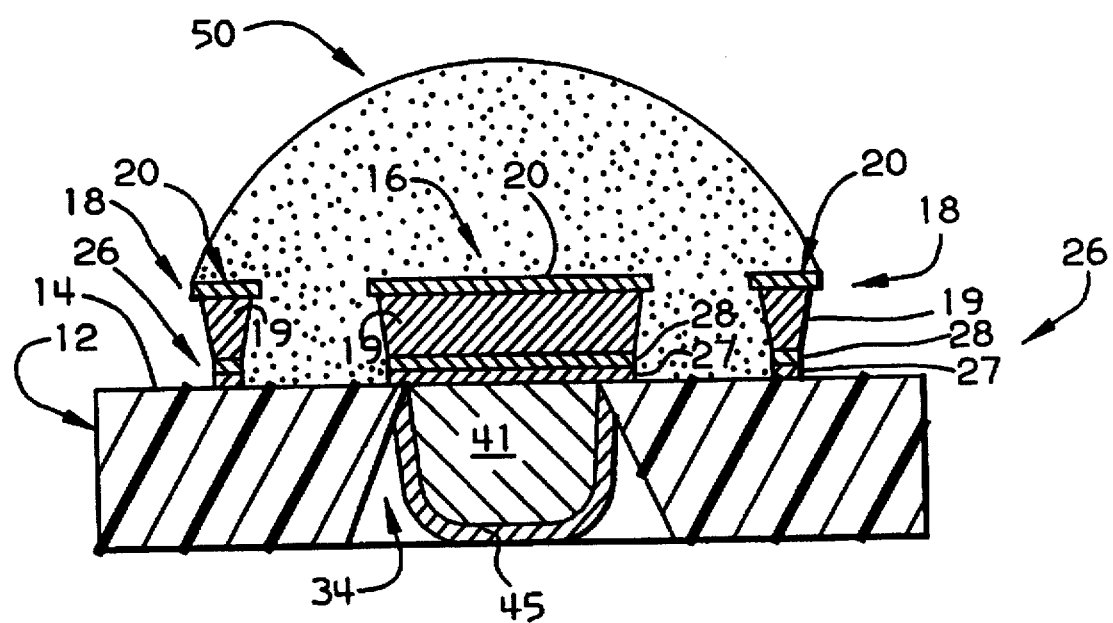
FIG. 7 illustrates the circuitized substrate of FIG. 6 after application of encapsulant material over both the circuitry of the substrate and part of the barrier means formed in accordance with the teachings herein.

In FIG. 7, a liquid material 50 is added. Preferably, liquid material 50 is encapsulant material, a preferred example being Hysol 4450, available from Dexter Corporation of Olean, N.Y. This material is dispensed using standard needle dispensing equipment. Most significantly, the liquid encapsulant extends readily outwardly to both barrier members 18 and is prevented from additional flow beyond said members. Of further significance, the liquid was able to form the substantially domed configuration in FIG. 6, having in one embodiment, a thickness of 0.020 to 0.050 inch above the upper surface of conductor 16. Material 50 was then allowed to solidify. Such a thickness assures adequate coverage (and protection) of the underlying conductor 16, particularly if said conductor includes added structures, e.g., wires (e.g., gold) wirebonded thereto.

Figure 8:
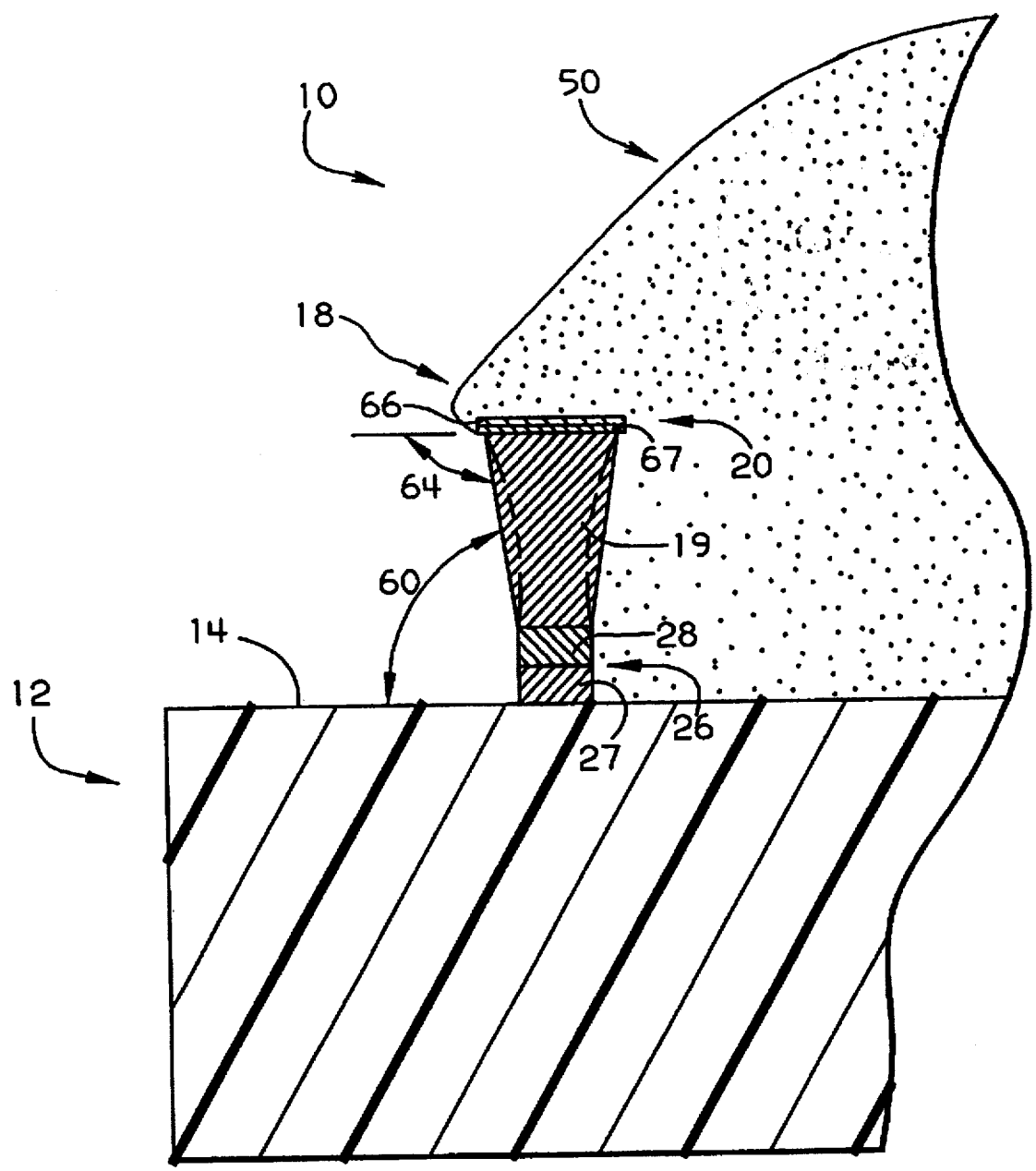
FIG. 8 is a still further enlarged view (compared to FIGS. 1–7) better illustrating the barrier means (particularly the various angles formed by the surfaces thereof) in accordance with one embodiment of the invention.

In FIG. 8, a greatly enlarged view of barrier member 18 is provided for illustration purposes. The etching process described in FIG. 6 forms a first angle 60 (e.g., 45 to 90 degrees) between surface 14 of dielectric layer 12 and the first portion 19 of member 18. Also formed is a second angle 64 (e.g., 45 to 135 degrees) between this first portion and second portion 20. Second portion 20 is understood to comprise at least one thin layer 66 of a metal or metal alloy different from the metal or metal alloy used for first portion 19. A preferred example of such a second metal or alloy is gold. Significantly, this second metal or alloy provides a lesser surface tension with respect to liquid material 50 when this material attempts to flow thereacross compared to the surface tension exhibited by portion 19. It is believed that the use of different metals and/or metal alloys for both portions 19 and 20 of member 18, combined with selection of different angular orientations of such portions, accounts for the increased surface tension by portion 19 to thereby prevent material 50 flow beyond the location of intersection substantially between portions 19 and 20. Preferably, portion 20 is extremely thin in comparison to the corresponding thickness of underlying portion 19, as shown in FIG. 8. As also seen in FIG. 8, portion 20 conforms to the upper surface of portion 19.

As stated above, second portion 20 of barrier member 18 is preferably comprised of two parts (or separate, thin layers), shown in FIG. 8 by numerals 66 and 67. Layer 67, located immediately on underlying copper portion 19, is preferably of nickel having a thickness of about 20 to about 90 microinches. Thin layer 66 is preferably of gold, also with a thickness of about 20 to about 90 microinches, or about the same as layer 67.

Although the surface of the barrier member's side walls are shown as being straight (planar), it is readily possible to provide this surface with a slight curvature (shown in phantom in FIG. 8) such that it will appear slightly convex. Such a curved configuration is possible using a chemical etching process and adjusting the various parameters thereof during material etch.

While there have been shown and described what are at present considered the preferred embodiments of the invention, it will be obvious to those skilled in the art that various changes and modifications can be made therein without departing from the scope of the invention as defined by the appended claims.

What is claimed is:

1. A circuitized substrate comprising:
   a dielectric layer including a first surface;
   an electrical conductor positioned on said first surface of said dielectric layer; and
   a barrier member for preventing the flow of liquid material thereover, said barrier member including a first portion, having an outer side and being of a first configuration positioned on said first surface of said dielectric layer adjacent said electrical conductor and a second portion, having at least one surface immediately adjacent said outer side of said first portion and being of a second configuration, said second portion positioned atop said first portion, said first portion of said barrier member providing a greater surface tension with respect to said liquid material than said second portion of said barrier member sufficiently to allow the flow of said liquid material over said at least one surface of said second portion but not onto said outer side of said first portion.

2. The circuitized substrate of claim 1 wherein said dielectric layer is comprised of a polymer material.

3. The circuitized substrate of claim 2 wherein said polymer material is polyimide.

4. The circuitized substrate of claim 1 wherein said first portion of said barrier member is comprised of a first metal or metal alloy.

5. The circuitized substrate of claim 4 wherein said second portion of said barrier member is comprised of a second metal or metal alloy different than said first metal or metal alloy.

6. The circuitized substrate of claim 5 wherein said first metal or metal alloy is comprised of copper and said second metal or metal alloy is comprised of a noble metal.

7. The circuitized substrate of claim 6 wherein said noble metal is gold.

8. The circuitized substrate of claim 7 wherein said copper has a thickness of only about 0.0005 to 0.0015 inches and said gold has a thickness of about 20 to 90 microinches.

9. The circuitized substrate of claim 5 wherein said second portion of said barrier member includes first and second parts, said first part of said second portion being comprised of a third metal or metal alloy.

10. The circuitized substrate of claim 9 wherein said third metal or metal alloy is different than said first metal or metal alloy and second metal or metal alloy.

11. The circuitized substrate of claim 9 wherein said first metal or metal alloy is comprised of copper having a thickness of about 0.0005 to 0.0015 inches, said second metal or metal alloy is comprised of gold having a thickness of about 20 to 90 microinches, and said third metal or metal alloy is comprised of nickel having a thickness of about 20 to 90 microinches.

12. The circuitized substrate of claim 1 wherein said first portion of said barrier member includes a surface which forms a first angle with said first surface of said dielectric layer.

13. The circuitized substrate of claim 12 wherein said first angle between said surface of said first portion of said barrier member and said first surface of said dielectric layer is about 45 to 90 degrees.

14. The circuitized substrate of claim 12 wherein said second portion of said barrier member includes a surface which forms a second angle with said surface of said first portion of said barrier member.

15. The circuitized substrate of claim 14 wherein said second angle is about 45 to 135 degrees.

16. The circuitized substrate of claim 1 wherein said first portion of said barrier member includes a substantially curved surface.

17. The circuitized substrate of claim 1 wherein said electrical conductor is thermally conductive and includes a first part positioned adjacent said barrier member.

18. The circuitized substrate of claim 17 wherein said first part of said electrical conductor is comprised of copper or copper alloy.

19. The circuitized substrate of claim 17 wherein said electrical conductor includes a second part connected to said first part of said electrical conductor.

20. The circuitized substrate of claim 19 wherein said second part of said electrical conductor is comprised of copper or copper alloy.

21. The circuitized substrate of claim 19 further including a hole in said dielectric material adjacent said electrical conductor.

22. The circuitized substrate of claim 21 wherein said second part of said electrical conductor projects through said hole.

23. A method of forming a circuitized substrate, said method comprising:

providing a dielectric layer having a first surface;

positioning an electrical conductor on said first surface of said dielectric layer; and forming a barrier member on said first surface of said dielectric layer for preventing the flow of liquid material thereover, by initially forming a first portion, having an outer side, on said first surface of said dielectric layer adjacent said electrical conductor and thereafter forming a second portion, having at least one surface immediately adjacent said outer side of said first portion, on said first portion of said barrier member, said first portion of said barrier member being of a first configuration and said second portion of said barrier member being of a second configuration, said second portion positioned atop said first portion, said first portion providing a greater surface tension with respect to said liquid material than said second portion to thereby allow said flow of said liquid material over said at least one surface of said second portion but not onto said outer side of said first portion.

24. The method of claim 23 wherein said first portion of said barrier member is formed using a photolithography process.

25. The method of claim 24 wherein said forming said first portion of said barrier member includes depositing a metal seed layer on said first surface of said dielectric layer.

26. The method of claim 25 wherein said depositing of said seed layer is accomplished using sputter deposition.

27. The method of claim 26 wherein said first portion is further formed by depositing photoresist, irradiating said photoresist, chemically removing portions of said photoresist, and thereafter performing an electroplating operation.

28. The method of claim 27 wherein said second portion is formed by electroplating.

29. The method of claim 28 wherein a predetermined first angle is formed between said first portion of said barrier member and said first surface of said dielectric layer using a chemical etching operation.

30. The method of claim 29 wherein a predetermined second angle is formed between said first portion of said barrier member and said second portion of said barrier member using a chemical etching operation.

31. The method of claim 23 further including forming a hole in said dielectric layer adjacent said electrical conductor.

32. The method of claim 31 wherein said hole is formed by depositing photoresist on said dielectric layer, irradiating selected parts of said photoresist, chemically removing said selected parts of said photoresist, and chemically removing a portion of said dielectric layer not having said photoresist thereon.

33. The method of claim 31 wherein said electrical conductor includes a first part, said method further including forming a second part of said electrical conductor, said second part of said conductor projecting through said hole.

34. The method of claim 33 wherein said second part is formed using an electroplating operation.

35. The method of claim 23 wherein formation of said first portion of said barrier member comprises laminating a metal layer onto said dielectric layer.

36. The method of claim 35 wherein said second portion of said barrier member is formed by depositing photoresist material onto said first portion of said barrier member, irradiating said photoresist material, chemically removing portions of said photoresist material, and thereafter performing an electroplating operation.

37. The method of claim 36 wherein said first portion of said barrier member is further formed by removing said photoresist material and chemically etching said laminated metal layer, said second portion acting as an etchant mask during said chemically etching of said laminated metal layer.

38. The method of claim 37 further including forming a surface within said first portion of said barrier member which forms a first angle with said first surface of said dielectric layer.

39. The method of claim 38 further including forming a surface within said second portion of said barrier member which forms a second angle with said formed surface of said first portion of said barrier member.

* * * * *